US008612578B2

(12) United States Patent  
Ricketts

(10) Patent No.: US 8,612,578 B2
(45) Date of Patent: Dec. 17, 2013

(54) FORECAST-LESS SERVICE CAPACITY MANAGEMENT

(75) Inventor: John A. Ricketts, Clarendon Hills, IL (US)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 13/045,030

(22) Filed: Mar. 10, 2011

(65) Prior Publication Data

US 2012/0232868 A1   Sep. 13, 2012

(51) Int. Cl.
*G06F 15/173* (2006.01)

(52) U.S. Cl.
USPC ............ 709/224; 717/138; 717/127; 703/6; 703/22

(58) Field of Classification Search
USPC ............ 709/224; 717/124, 127, 131; 703/22
See application file for complete search history.

(56) References Cited

U.S. PATENT DOCUMENTS

| | | | |
|---|---|---|---|
| 5,093,794 A | 3/1992 | Howie et al. | |
| 5,390,243 A | 2/1995 | Casselman et al. | |
| 5,586,021 A | 12/1996 | Fargher et al. | |
| 5,684,964 A | 11/1997 | Powers et al. | |
| 5,799,173 A | 8/1998 | Gossler et al. | |
| 5,812,780 A * | 9/1998 | Chen et al. | 709/224 |
| 5,958,009 A | 9/1999 | Friedrich et al. | |
| 6,219,829 B1 * | 4/2001 | Sivakumar et al. | 717/131 |
| 6,473,721 B1 | 10/2002 | Chacon et al. | |
| 6,501,473 B1 | 12/2002 | Hayes et al. | |
| 6,556,974 B1 | 4/2003 | D'Alessandro | |
| 6,678,250 B1 | 1/2004 | Grabelsky et al. | |
| 6,711,607 B1 | 3/2004 | Goyal | |
| 6,823,382 B2 | 11/2004 | Stone | |
| 6,885,641 B1 | 4/2005 | Chan et al. | |
| 6,901,536 B2 | 5/2005 | Davenport | |
| 6,963,542 B2 | 11/2005 | Manthoulis et al. | |
| 7,113,986 B2 | 9/2006 | Goldszmidt et al. | |
| 7,370,092 B2 * | 5/2008 | Aderton et al. | 709/220 |
| 7,656,802 B2 | 2/2010 | Ricketts | |
| 7,881,961 B2 | 2/2011 | Ricketts | |
| 8,234,229 B2 * | 7/2012 | Castelli et al. | 706/21 |
| 2002/0019873 A1 | 2/2002 | Goldszmidt et al. | |

(Continued)

OTHER PUBLICATIONS

Constraints Management Group, LLC, (CMG) "Constraints Management User Conference 2004—Highlights of our Second Annual User Conference", 2004.

(Continued)

*Primary Examiner* — Abdullahi Salad
(74) *Attorney, Agent, or Firm* — John R. Pivnichny; Law Office of Jim Boice

(57) ABSTRACT

A computer implemented method, system, and/or computer program product manages capacity in a service-provider system. A software model of a physical service-provider system is created and stored in memory. A parameter for running the software model with real-time metrics from the physical service-provider system as inputs to the software model is established. If the parameter is met, then the software model is run using the real-time metrics from the physical service-provider system as inputs. A pre-determined action, which adjusts capacity in the service-provider system and is prescribed by a specific model output, is established. If the specific model output, which resulted from using the real-time metrics from the physical service-provider system as inputs for running the software model, is output from the software model, then the pre-determined action is executed.

20 Claims, 5 Drawing Sheets

(56) References Cited

U.S. PATENT DOCUMENTS

| | | | |
|---|---|---|---|
| 2002/0147745 A1 | 10/2002 | Houben et al. | |
| 2003/0125996 A1 | 7/2003 | Bush et al. | |
| 2003/0177081 A1 | 9/2003 | Woehr | |
| 2004/0039625 A1 | 2/2004 | Malnack et al. | |
| 2004/0172341 A1 | 9/2004 | Aoyama et al. | |
| 2004/0186605 A1 | 9/2004 | Wu et al. | |
| 2005/0010598 A1 | 1/2005 | Shankar | |
| 2005/0165635 A1 | 7/2005 | Moessner | |
| 2005/0165930 A1 | 7/2005 | Whitman, Jr. | |
| 2005/0195741 A1 | 9/2005 | Doshi et al. | |
| 2006/0020924 A1* | 1/2006 | Lo et al. | 717/127 |
| 2007/0094381 A1* | 4/2007 | Weiss et al. | 709/224 |
| 2007/0156508 A1* | 7/2007 | Gilpin et al. | 705/10 |
| 2008/0077368 A1 | 3/2008 | Nasle | |
| 2008/0092122 A1* | 4/2008 | Caprihan et al. | 717/127 |
| 2010/0306353 A1* | 12/2010 | Briscoe et al. | 709/221 |
| 2011/0302569 A1* | 12/2011 | Kunze et al. | 717/169 |

OTHER PUBLICATIONS

Constraints Management Group (CMG), "Constraint Management (DBR) Scheduling and Software", Constraints Management User Conference 2004, May 18-1, 2004, pp. 1-30.

Constraints Management Group (CMG), "Applied Buffer Management", Constraints Management User Conference 2004, May 18-21, 2004, pp. 1-47.

Steyn, H., "Synchronising Resources to Maximise the Work Performed on Concurrent Projects", Critical Chain Symposium 2002.

Brown, T. P., "Multi-Project Critical Chain and Buffer Management for Capital and Innovation Projects", Critical Chain Symposium 2002.

Anderson, David J., "Making the Business Case for Agile Management—Simplifying the Complex System of Software Engineering", Jul. 12-15, 2004, pp. 1-13.

Marshall, C.R., "Improving Business Performance by Managing Constraints", Central Wisconsin Economic Research Bureau, Division of Business and Economics, Univ. of Wisconsin—Stevens Point, 2002.

Simons, et al., "An Exposition of Multiple Constraint Scheduling as Implemented in the Goal System (Formerly Disaster)", Production and Operations Management Society, vol. 6, No. I, pp. 3-22, Spring 1997.

O'Donovan, B., "Managing Supply Chain Performance in Electronic Organisations: A TOC Approach", Faculty of Information and Engineering Systems, Leeds Metropolitan University, Section I, pp. 36-44, 2003.

Hagan L., "Improving Journal Quality with Process Improvement Methods", The Sheridan Press, White Paper, May 2000.

Lilly Software Associates, Inc., "Manufacturing: Drum-Buffer-Rope", Visual DBR, 2004.

M2M MADE2MANAGE Systems, "With TOC and M2M Synchronizer, Abba Systems Conquers Barriers to Growth".

"Real-Time schedule adjustment decisions: a case study", Hur, Daesik; Mabert, Vincent A.; Bretthauer, Kurt M.; Omega 32(2004) 333-344.

Hammonds, et al. "Service Monitoring and Control." Microsoft Corporation. Archived on Apr. 13, 2003 by the Internet Archive: <http://web.archive.org/web/20030413074004/www. microsoft.com/technet/itsolutions/msm/smf/smfsmc.asp>. pp. 1-74.

"A Quantitative Assured Forwarding Service" Christin, Nicolas; Liebeherr, Jorg; Abdelzaher, Tarek F.; Technical Report: University of Virginia, CS-2001-21.

"Feedback control with queueing-theoretic prediction for relative delay guarantees in web servers", Ying Lu; Abdelzaher, T.;Chenyang Lu; Lui Sha; Xue Liu; Dept. of. Comput. Sci., Virginia Univ., Charlottesville, VA, USA; Real-Time and Embedded Technology and Applications Symposium, 2003, Proceedings. The 9th IEEE Publication Date: May 27-30.

"Capacity Utilization: Concept, Measurement and Recent Estimates"; Klein, Lawrence R.; Long, Virginia; Greenspan, Alan; Greenwald, Douglas; Edmonson, Nathan; Perry, George; Brookings Papers on Economic Activity, vol. 1973, No. 3 (1973), pp. 743-763.

"The WSLA Framework: Specifying and Monitoring Service Level Agreements for Web Services", Keller, Alexander; Ludwig, Heiko; Journal of Network and Systems Management, vol. 11, No. 1, Mar. 2003.

"Defining and Monitoring Service Level Agreements for Dynamic e-Business", Keller, Alexander; Ludwig, Heiko; pp. 189-204 of the Proceedings of LISA '02: Sixteenth Systems Administration Conference, (Berkeley, CA: USENIX Association, 2002).

"Setting Job-Shop Due-Dates with Service-Level Constraints" Bookbinder, James H.; Noor, Afzal Ibn; The Journal of the Operational Research Society, vol. 36, No. 11 (Nov. 1985), pp. 1017-1026.

"Using Control Theory to Achieve Service Level Objectives in Performance Management", Parekh, S.; Gandhi, N.; Hellerstein, J.; Tilbury, D.; Jayram, T.; Bigus, J.; Real-Time Systems, 23, 127-141, 2002 (c) 2002 Kluwer Academic Publishers.

V Christin et al. (A Quantitative Assured Forwarding Service; Christin, Nicolas; Liebeherr, Jorg; Abdelzaher, Tarek F.; Technical Report: University of Virginia, CS-2001-21).

U.S. Appl. No. 11/055,403, Restriction Requirement dated Sep. 4, 2009.

U.S. Appl. No. 11/055,403, Response to Restriction Requirement dated Oct. 8, 2009.

U.S. Appl. No. 11/055,403, First Office Action dated Jan. 26, 2010.

U.S. Appl. No. 11/055,403, First Response dated Jun. 23, 2010.

U.S. Appl. No. 11/055,403, Notice of Allowance dated Sep. 23, 2010.

U.S. Appl. No. 11/559,552, First Office Action dated Apr. 6, 2009.

U.S. Appl. No. 11/559,552, First Response dated Jul. 6, 2009.

U.S. Appl. No. 11/559,552, Notice of Allowance dated Sep. 17, 2009.

Robertson et al., "Optimizing Networks of Traffic Signals in Real Time—The Scoot Method," IEEE Transactions on Vehicular Technology, vol. 40, No. 1, Feb. 1991, pp. 11-15.

* cited by examiner

FORECAST-LESS SERVICE CAPACITY MANAGEMENT

BACKGROUND

The present disclosure relates to the field of computers, and specifically to the use of computers in providing services. Still more particularly, the present disclosure relates to the use of computers in facilitating service capacity when providing services.

Management of service capacity is often performed through the use of forecasts. These forecasts estimate how much capacity is needed at various points in a process that provides a particular service, and then locks in that capacity. Such forecasts are unable to account for random variability, which often leads to shortage or excess capacity. Furthermore, the longer it takes to adjust service capacity, the longer managers want the forecast horizon to be, which further decreases accuracy of the forecast. Thus, managing capacity based on forecasts is a vicious cycle.

Furthermore, forecast-based capacity management that is range-based (as opposed to the point forecast described above) requires a provider of the service to predict the maximum and minimum demand expected out to a specified time horizon, rather than predicting demand during individual periods within that horizon. The maximum allowable range is usually specified in a service contract with a customer, so neither party can specify an arbitrarily narrow or wide range. Thus, the service provider is obligated to satisfy demand only within the predicted limits, while the customer is obligated to compensate the service provider for excess capacity when demand falls below the minimum forecast. Therefore, both parties (customer and service provider) have an incentive to create an accurate forecast, which is inherently hard to do, so that both parties share the consequences of inaccurate forecasts.

BRIEF SUMMARY

A computer implemented method, system, and/or computer program product manages capacity in a service-provider system in a forecast-less manner. A software model of a physical service-provider system is created and stored in memory. A parameter for running the software model with real-time metrics from the physical service-provider system as inputs to the software model is established. If the parameter is met, then the software model is run using the real-time metrics from the physical service-provider system as inputs. A pre-determined action, which adjusts capacity in the service-provider system and is prescribed by a specific model output, is established. If the specific model output, which resulted from using the real-time metrics from the physical service-provider system as inputs for running the software model, is output from the software model, then the pre-determined action is executed.

DETAILED DESCRIPTION

Figure 1:
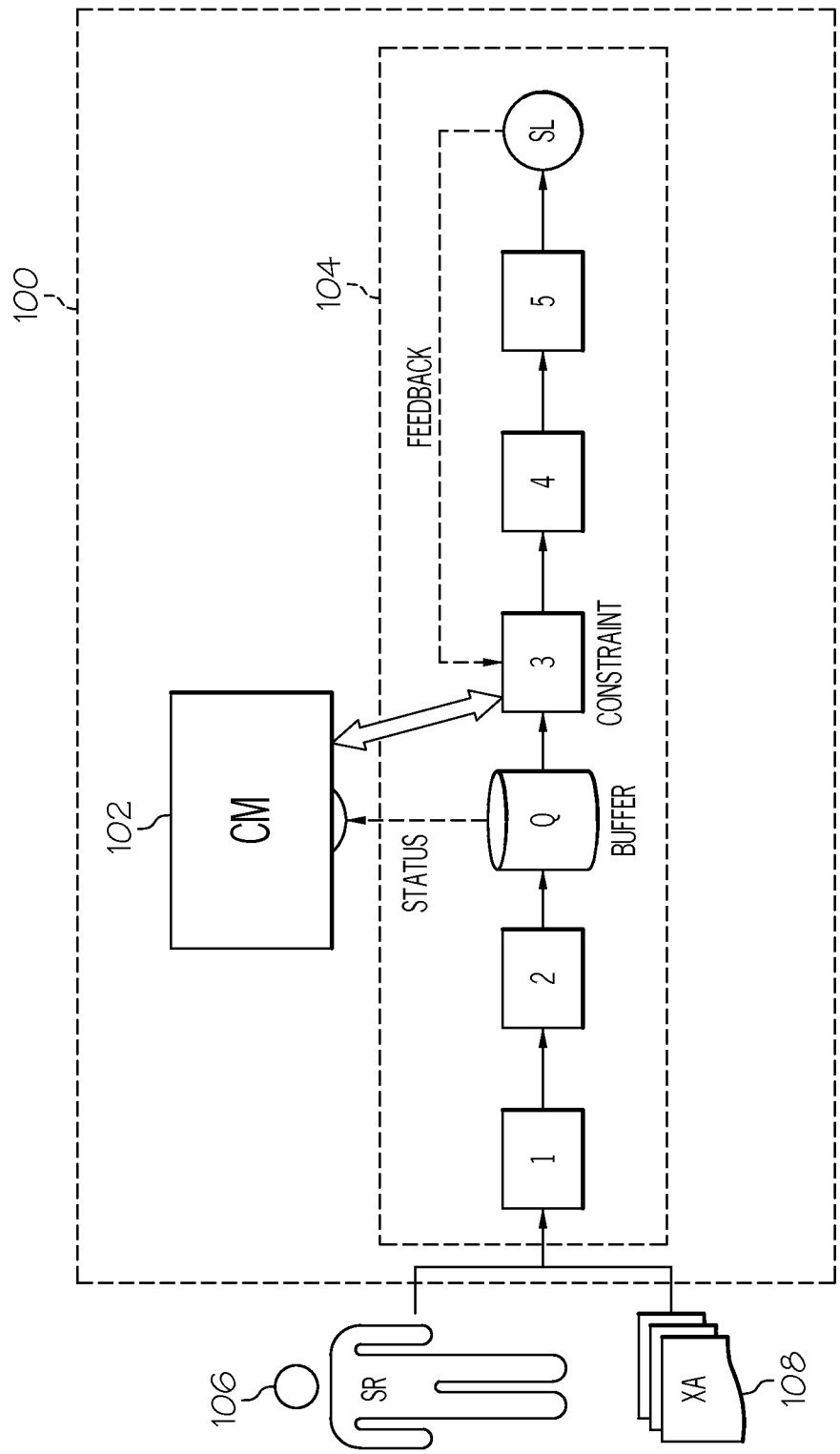
FIG. 1 depicts an exemplary simple service-provider system in which the present disclosure may be implemented.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures, and in particular to FIG. 1, an exemplary service-provider system 100 as contemplated for use with the present disclosure is presented. A capacity management system 102 oversees/manages operations of service process resources 104. Note that service process resources 104 are real physical resources, such as processors, servers, storage devices, etc. In one embodiment, the real physical resources are persons, who are capable of performing one or more specific tasks related to the service being provided. Blocks 1-5 depict resources that perform corresponding steps 1-5 in a process. In the example of FIG. 1, resource 3 (which performs step 3 from steps 1-5 of the process) is a constraint, meaning that it has less capacity than any other of the resources represented by blocks 1-5. For example, assume that the service process resources 104 fulfill service requests (i.e., "demands") received either as a written/spoken demand from a human service requester 106, and/or as a transaction 108 from a computer system. For ease of explanation, assume that the resources represented by blocks 1-2 and 4-5 are each able to handle 100 transactions per hour, but the resource represented by block 3 is only able to handle 90 transactions per hour. This condition results in the buffer Q being filled with demands/requests/jobs that have been completed by the resources represented by blocks 1-2, but which the resource in block 3 is unable to keep up with. This constraint (3) also results in the resources represented by blocks 4-5 only being able to handle 90 transactions per hour, since that is the maximum number of completed tasks that the resource represented by block 3 is capable of supplying to them. SL represents the service level monitor of the service process resources 104, and measures the speed, cost, and quality of service provided by the service process resources 104.

Feedback from SL, based on current and projected service levels, tells the constraint block 3 which service requests to work on next. When the content level of the queue/buffer Q ahead of the constraint block 3 rises above an upper threshold, an increase in capacity for block 3 is triggered. When the content level of the queue/buffer Q falls below a lower threshold, a decrease in capacity for block 3 is triggered. Failure to adjust capacity typically causes one or more service levels to deviate from the service level agreement between the client and service provider.

Note that the service process resources 104 differ from conventional balanced-capacity management methods by focusing capacity management on the process constraint. In one embodiment, only the constraint and perhaps a few other elements in the process actually require capacity adjustments. This contrasts with balanced-capacity methods, where capacity changes are more difficult because they must be applied across the entire service process to maintain balance. Service providers tend to resist across-the-board capacity changes because they are expensive and slow. By adjusting capacity to meet demand, however, the present disclosure enables services "on demand." This contrasts with prevailing practice, which relies on relatively fixed capacity to deliver services "as available." That is, a fixed capacity system in which services are as available either requires the provider to engineer service delivery for peak demand, which is expensive, or it requires the client to accept less than timely service on some requests. Thus, some service recipients receive delayed service, degraded service, or no service at all.

Figure 2:
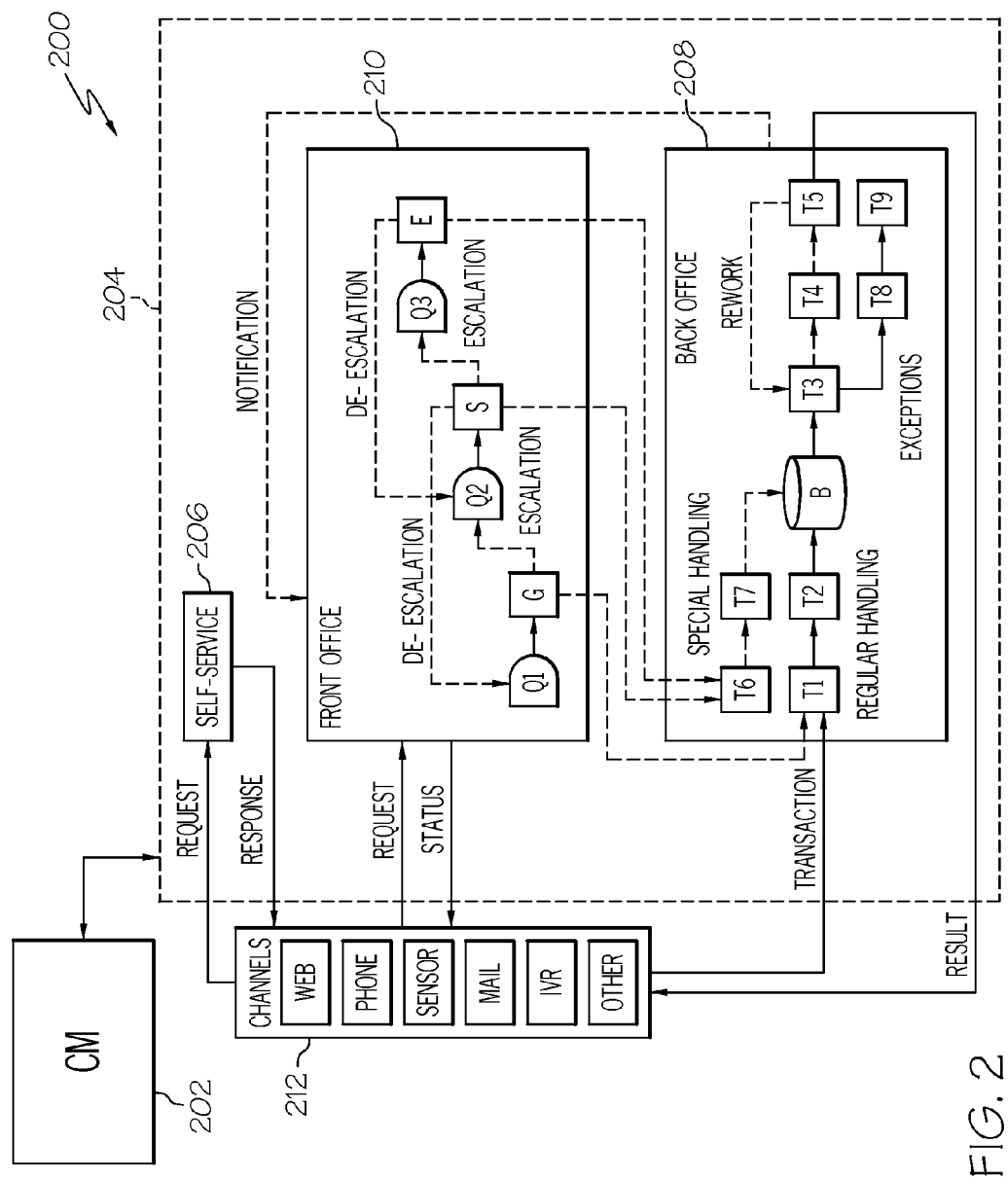
FIG. 2 illustrates a more complex service-provider system in which the present disclosure may be implemented.

FIG. 2 depicts a complex service scenario 200 in which various physical resources are depicted as a conceptual diagram. Real/actual processes are managed by a capacity management system 202, which oversees the functions/capacity of complex service resources 204. Such real/actual processes have varied topologies in a self service 206, a back office 208 and a front office 210, the latter of which contains possibly different tiers.

In an exemplary embodiment, service requests and transactions come through multiple channels 212. Some of these requests/transactions are handled by processes in the self-service 206 system of resources. Some of the requests/transactions are handled by processes in the back office 208 system of resources, which utilizes a process that does not involve direct interaction between service requesters and the service provider (204). Some of the requests/transactions (i.e., those that cannot be handled by the self-service 206 and/or the back office 208) are handled by processes in the front office 210 system of resources, which does involve direct interaction between requesters and the service provider 204. Front and back office processes can be entirely manual or semi-automated.

As depicted in FIG. 2, IVR stands for interactive voice response. Q1 to Q3 are queues of pending requests. In a front office process, callers placed on hold are waiting for service in those queues. Likewise, voice messages or text messages are held in queues. G stands for "generalists," also known as Tier 1 within the service provider. S stands for "specialists," also known as Tier 2 within the service provider. E stands for "experts," also known as Tier 3 within the service provider. T1 to T9 are tasks that must be performed in specific sequences. T3 is the back office constraint, which means its resource has less capacity than any other task. B stands for "buffer." In a back office process, buffers hold transactions waiting for further processing. Though buffers may exist ahead of any task, only one buffer is drawn in the figure because it is the only one used to trigger capacity changes in the back office. Dashed lines are optional flows. Solid lines are mandatory flows.

Roles

Several roles apply to service scenarios: Service providers deliver services; Clients are customers of a service provider; Service requesters ask for service; Service recipients receive service. The client, requester, and recipient roles can be fulfilled by one or multiple entities. For instance, a homeowner calling a plumber fills the client, requester, and recipient roles simultaneously. Suppose, however, that the service provider delivers hotel room reservations and the client is a business. The service requesters could be travel administrators, and the service recipients could be personnel traveling on business.

Channels

Service requests and transactions can be transmitted from service requesters to the service provider through multiple channels 212, including the web (Internet), telephone, sensors, paper mail, electronic mail, interactive voice response, and any other channel, such as texting and instant messaging, that is capable of transmitting such requests/transactions.

The particular channel from channels 212 used has no impact on capacity management unless that channel implies urgency and thereby affects priorities. For instance, mail can be handled at any hour because it is asynchronous, but telephone calls must be handled as they arrive because they are synchronous.

Each channel from channels 212 is also a means for the service provider to communicate a response, status, or result back to the service requester. However, the actual service delivery may take place at a different place and time from such communications.

Self-Service

In self-service system 206, service requesters complete the service by themselves, using the service provider's automation. Examples include automatic teller machines (ATMs) at banks, automatic stock trading by limit-sell orders, automatic credit card activation by telephone, automatic cell phone activation by web browser, and automatic toll collection by vehicle transponder.

Front Office Process

In a front office process provided by the front office 210, generalists have basic skills, and specialists have higher skills, but there are fewer specialists than generalists. Experts have the highest skills, but there are even fewer experts than specialists. For instance, the ratio of generalists to specialists may be 10:1, and ratio of generalists to experts may be 100:1.

Service requests are frequently routed initially to generalists in Tier 1. Even if there is a single queue for all incoming contacts, there may nevertheless be a priority scheme, with priority customers and/or emergencies advanced to the head of that queue.

When generalists cannot provide the necessary service, they can escalate the service request to Tier 2, which has deeper skills, enhanced information, or better technology. Similarly, the service request can be escalated from Tier 2 to Tier 3. However, a process may be designed to let selected service recipients enter directly at higher tiers. Sometimes the selection is based on service recipient attributes, with preferred customers being routed directly to specialists via dedicated toll-free phone numbers or routing based on their service entitlements. Alternatively, service recipients may be routed directly to higher tiers based on the type of service requests they make. For instance, if service requests require diagnosis of difficult problems, the service provider may route such calls directly to specialists, who then de-escalate the contact to generalists for solution once the problem is properly diagnosed. This frees the specialists to diagnose other problems while using generalists for tasks not requiring higher skills.

Back Office Process

Transactions can enter a back office process in the back office 208 directly from channels 212 or indirectly through a front office process from the front office 210. For example, customers can mail in a check, or they can call a toll-free number and pay via a credit card. In both cases, the payment is processed in the back office, but in the latter case it enters through the front office process.

In a back office process, transactions typically enter at specific tasks. In FIG. 2, these tasks are depicted as T1 for regular handling and T6 for special handling. For instance, T1 might be "scanning of bar code" while T6 might be "manual data entry from hand-written document," or T1 might proceed at normal speed while T6 is expedited.

In FIG. 2, regardless of whether transactions get regular or special handling, they converge at the buffer ahead of the constraint, T3. Like the queues in the front office process, items in the buffer may be prioritized rather than handled strictly first-in, first-out. Those priorities are set based on their anticipated effect on service levels. For instance, transactions nearing or beyond their due date would be given high priority.

The path through T3, T4, and T5 completes regular handling. However, transactions may branch from T3 to T8 and T9 when there are exceptions. For example, an exception can occur when a different policy applies, such as credit verification on purchases exceeding a limit or identity verification on purchases of hazardous materials.

In FIG. 2, the exception path converges with the regular handling path at T5. However, transactions may loop back to T3 when rework is required. For example, rework is required when data is incorrect or incomplete or inconsistent, and must therefore be corrected and reprocessed. Rework is also required when quality control detects a problem.

Notification from a back office process to a front office process allows the front office process to proceed if it was suspended during the back office process. For instance, if the front office process coordinates personnel relocation services, notification that a household mover has been assigned in the back office allows the front office process to resume.

Service Delivery

Service delivery is inherent in FIG. 2 because it can occur virtually anywhere in the diagram. Self-service is a mode of service delivery that automates the service provider's role. In a front office process, any tier can deliver service, such as activating an Internet connection or authorizing a refund. In a back office process, any task can deliver service, such as replacing or repairing a product under warranty.

Unlike job routings in a factory, which typically follow a planned path, the path a particular service request will take through a business process is generally less predictable. However, the probability that service requests will undergo escalation, de-escalation, special handling, exceptions, or rework can be estimated from historical data. Thus, paths for collections of service requests are reasonably predictable under normal circumstances.

When unusual events occur, however, the normal paths and loads may no longer apply. For instance, a natural disaster can rapidly overload self-service to the point that ATMs run out of cash. A financial panic can overload a front office process to the point that calls are dropped. And a mistake in an advertisement can overload a back office process with invalid transactions.

One reason the normal paths and loads no longer apply is the constraint may have shifted. Since the present disclosure uses constraints to trigger capacity changes, a shift in the constraint can have a significant impact on capacity management. Consequently, capacity management decisions under ordinary conditions differ from such decisions under extraordinary conditions.

Constraints

In self-service, any element of the automation can be the constraint. It could be data communications, computer storage, computer processing—or even the items being dispensed, such as cash or tickets or beverages.

In a front office process, experts are usually the resource constraint because it takes a long time to grow expert skills. In the short run, however, any tier can be the constraint if the pattern of demand for service overloads that tier. Thus, capacity management has to include both long-run and short-run adjustments.

In a back office process, a strategic constraint is a task that is designed to have less capacity than other tasks in order to serve as a control point on the overall process. Since the constraint governs what the process overall can produce, adjusting capacity there regulates the entire process.

Capacity Management

In one embodiment of the present disclosure, capacity management is triggered by workload ahead of the constraint. When the buffer level strays and stays outside the target buffer zone, this triggers adjustment in service capacity.

Short-run adjustments can be rapidly activated and deactivated, typically within minutes or hours. For instance, additional virtual machines can be provisioned, or physical web servers can be shut down.

Intermediate-run adjustments can be activated and deactivated over a longer time horizon, typically within days or weeks. For instance, workers can be scheduled to work overtime or take extra days off.

Long-run adjustments take much longer to activate and deactivate, typically over months or years. For instance, hiring and training can produce higher skills, and releasing sub-contractors can alleviate excess resources.

Long-run adjustments are made strategically as part of resource management when intermediate-run adjustments are unable to meet service level agreements. Likewise, intermediate-run adjustments are made tactically when short-run adjustments are unable to meet service level agreements. Short-run adjustments are made operationally as part of service delivery.

Figure 3:
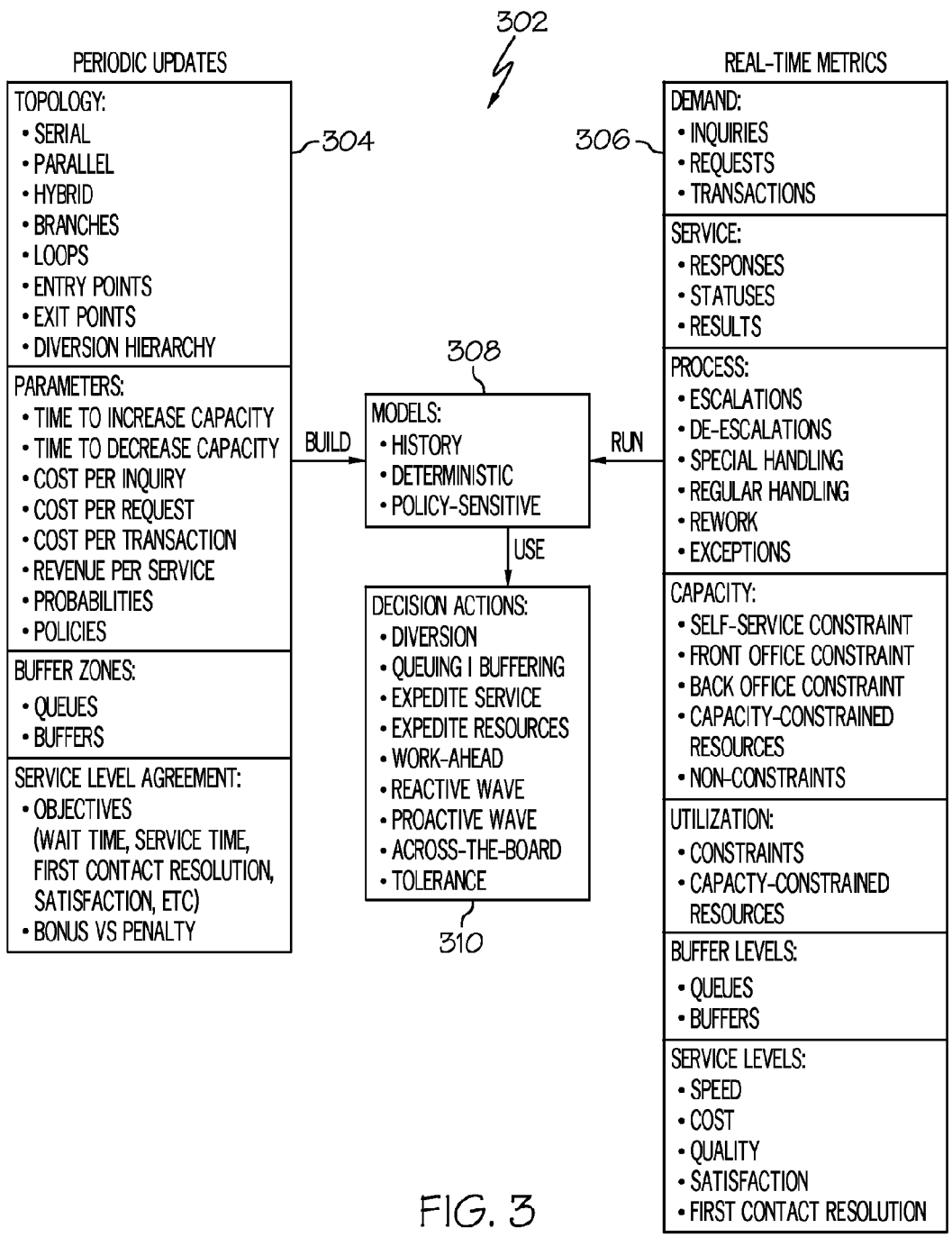
FIG. 3 depicts details from a capacity management process used by a capacity manager depicted in FIGS. 1-2.

Referring now to FIG. 3, one embodiment of the present disclosure utilizes a method and/or system that embodies models, plus the data needed to build and run those models. This approach to capacity management is different from prevailing balanced-capacity models because in addition to being forecast-less, changes in capacity driven by this invention are more localized.

Optimally, the process of the present disclosure proceeds in three phases. First, models of actual/real systems are built and updated periodically. Second, the models are run using real-time metrics from the actual/real systems. Finally, the models are used for decision-making Capacity Management Models As shown in block 308, capacity management models included in the present disclosure can be historical, deterministic, and/or policy-sensitive.

A historical model shows (1) how past demand triggered capacity changes and (2) how service levels responded to those capacity changes. Such models are used to learn from organizational experience.

A deterministic model shows (1) how current demand could be addressed through capacity changes and (2) how service levels would probably respond to those capacity changes. Such models are used to evaluate basic alternatives before implementation. Note that the deterministic model is not a forecast, but rather is just a likely outcome of reconfiguring the real system based on results of running the deterministic model.

A policy-sensitive model shows (1) how current demand could be addressed by changing policies as well as capacity and (2) how service levels would probably respond to those capacity changes. Such models are used to evaluate complex alternatives before implementation.

Note that the historical, deterministic, and policy-sensitive models are not mutually exclusive, and can be combined into a single model that utilizes the features/advantages provided by each of the different models.

Building the Models

Building models is an iterative process of creating, validating, and tuning Validation ensures the models correctly represent the service scenarios to be managed. Tuning makes the models more precise in their ability to manage service capacity so that service level agreements are attainable.

As depicted in block 304, inputs to the model building process include: Topology—directed cyclic graph of service delivery elements; Parameters—numeric values associated with each element of the model; Buffer zones—thresholds within queues and buffers that define high, normal, and low zones; and Service level agreements—objectives for service delivery and the consequences of achieving or not achieving those objectives. These inputs are periodically updated, then the models are revalidated and retuned.

Topology depicts the layout of self-service, the front office processes, and back office processes, as illustrated back in FIG. 2. Processes can have serial, parallel, or hybrid topologies. Processes may include branches and loops, as well as multiple entry points and exit points. Within the topology, demand for service may be diverted through a hierarchy of channels and delivery options, such as tiers in the front office and special handling in the back office.

Parameters include the time, dollars, and probabilities associated with each element of the models. For instance, the time needed to increase the number of experts is usually far greater than the time needed to increase generalists because generalists attain their skills with minimal training and experience while experts require extensive training and experience. The cost to respond to an inquiry with a live agent can easily be ten times the cost of self service automation. The probabilities that a transaction will require special handling or rework can be measured based on prevailing policies.

Buffer zones are the thresholds within queues and buffers that trigger capacity changes. For example, a decision may be made to keep processes with a queue within a certain range. If these processes are handing work requests, the capacity may be reduced (e.g., sending personnel home early, shutting down servers, disengaging third party resources, etc.) if the queue is underutilized, or the capacity may be increased (e.g., having persons work overtime, adding additional servers, bring on line on-demand services, etc.) if the queue is overfilled. Service level agreements typically allow some leeway on such decisions. The service provider's objective is not to make successive capacity adjustments in opposition, but to smoothly ratchet capacity up or down based on demand.

Service level agreements consist of multiple objectives and consequences of achieving or not achieving those objectives. For example, common objectives include answering a specified percent of calls within a specified number of seconds, resolving a specified percent of problems the first time a service request is made, and attaining a minimum level of customer satisfaction. When the objectives are over-achieved, the service provider may earn a bonus. When they are not achieved, the provider may pay a penalty.

Validation of the models is accomplished by comparing the structure of the models to data about past conditions. That is, the model topology is examined to ensure it matches the actual service topology. And the parameters are examined to ensure they match historical data. Then sampled or simulated metrics are fed into the models, the models are run in a test environment, and the model outputs are compared to desired results.

Tuning of the models is accomplished by comparing the behavior of the models to data about outcomes. That is, the buffer zones are examined to ensure they trigger capacity management appropriately. And the service level agreements are examined to ensure that the topology, parameters, and metrics generate capacity adjustments that meet the service level objectives.

Running the Models

Running models is the process of gathering real-time metrics and triggering the models to perform capacity management calculations when the buffer level strays and stays outside the target buffer zone. In other words, the models run in a production environment with live data to support both fully automated and human-made decisions.

Real-time metrics, as depicted in block 306, can be categorized as: Demand—inquiries, service requests, and transactions per period; Service—responses, statuses, and results per period; Process—sub-paths taken through the service scenarios, such as escalations, de-escalations, special handling, regular handling, rework, and exceptions; Capacity—amount of work that can be done per period by each resource type or each task; Utilization—portion of time that a resource or task is doing productive, billable work; Buffer levels—actual amount of work in the queue or buffer; and/or Service levels—actual service delivered during a period.

Capacity metrics can be further categorized as constraint, non-constraint, and capacity-constrained resource (CCR). A constraint has less capacity than any other resource, by definition, so it limits what the entire process can produce. A non-constraint either has enough spare capacity that even when the constraint's capacity is changed, the non-constraint is not likely to become a constraint—or the non-constrained resources are readily available from outside sources, such as subcontractors. CCRs, however, have just enough spare capacity not to be the current constraint, but not enough spare capacity to avoid becoming the new constraint every time the current constraint has its capacity increased—and CCRs are not always readily available from outside sources. When experts are the constraint and generalists are a non-constraint, specialists may be a CCR. With reference to FIG. 1, assume that the resources/processes described in block 3 are able to handle 90 service requests per hour. Assume further that all of the other blocks are able to handle 100 service requests per hour, except for block 1, which is able to handle 92 service requests per hour. As long as block 3 is only able to handle 90 per hour, it remains the constraint. However, block 1 is a capacity-constrained resource (CCR), since if block 3 is retuned to handle more than 92 per hour, then block 1 will now be the true constraint.

In one example, assuming that CCRs each have at least 10% spare capacity, the constraint can have its capacity increased to that limit before CCRs must have their capacity increased as well. The net effect, however, is that during most capacity management decisions, only the constraint requires an increase. And when additional resources require an increase, it may be limited to the CCRs. Thus, if the constraint and CCRs account for only 20% of total resources, capacity changes do not necessarily affect 100% of resources as they often do when processes are designed for balanced capacity.

Using the Models

When the workload ahead of the constraint strays and stays outside the normal zone, this triggers adjustment in service capacity. Models are used to determine where, when, and by how much capacity needs to be adjusted.

Short-, intermediate-, and long-run adjustments are distinguished by the time required to enact the adjustment. However, the various forms of adjustment can be applied independently or concurrently. For instance, current resources may work overtime until the service provider can hire additional resources.

Short-run adjustment may affect elements providing automation, the number of resources in a particular front office tier, or the number of resources performing a specific back office task. Short-run adjustment may also affect policies on work rules and technology parameters, such as those governing channels, entry-points, escalation, and de-escalation in the front office process. For example, when live agents are overloaded, technology may automatically route some callers to IVR or voice mail. Or calls coming into an entry-point at Tier 1 may be diverted temporarily to Tier 2. Members from higher tiers can thus be assigned work that would ordinarily be done by lower tiers, if necessary, thereby temporarily expanding capacity at the lower tiers. Conversely, selected work may be de-escalated from higher tiers to relieve overloading there.

Intermediate-run adjustments affect work schedules. That is, some resources may be scheduled to arrive early, stay late, work on weekends or holidays—or take extra time off.

Long-run adjustments affect the availability of skilled resources, in effect raising or lowering the ceiling on short-run and intermediate-run adjustments. Long-run adjustments may therefore change the location of constraints and the ceiling on CCRs. Though having a stable constraint—preventing "wandering constraints"—is the objective, there are times when the constraint is moved intentionally. For example, if the time to adjust capacity or cost to provide capacity changes, a strategic change in which resource is the constraint can exploit those speed and cost advantages. Also, if the process topology changes or the service level agreement changes, a strategic change in location of the constraint may be warranted during process redesign.

Capacity management decisions supported by models can take several forms:

Diversion—moves some work from the constraint to a non-constraint or CCR, often within the channels or across tiers in the front office;

Queuing/buffering—allows some work to pile up ahead of the constraint because there will be an opportunity to work off the backlog before service levels reach unacceptable levels;

Expediting service—selects work to be done next based on due dates and priorities rather than arrival sequence, then resources "sprint" (work at a faster-than-normal pace, which is achievable for a short time, but not sustainable indefinitely due to fatigue);

Expediting resources—hastens the arrival of resources from external sources, such as sub-contractors and the job market;

Work-ahead—performs some tasks ahead of demand based on reliable historical patterns, such as bringing additional video servers on-line before peak demand;

Reactive wave—temporarily increases capacity within a serial process only where queues have formed, which results in a pattern much like a bulge moving through a hose;

Proactive wave—increases capacity like a reactive wave, but does it before queues form, which can be accomplished when a wave of demand has already entered a serial process;

Across-the-board—changes capacity at all points within a process because the change in demand will be sustained, such as during a slack season or a peak season; and/or Tolerance—allows queues to form because they will dissipate naturally without a change in capacity.

Some of these decisions can be combined, such as queuing and expediting. Others, however, are unlikely to be combined, such as expediting and tolerance.

Decision Rules

Decisions are derived from model inputs via decision rules. For example, if buffer level exceeds upper threshold and demand is rising steadily, expedite service. In another example, if buffer level does not revert to normal zone, expedite resources. Similarly, if history indicates demand will eventually subside, adjust capacity in reactive wave. The present disclosure uses flexibility rather than predictability to meet service level objectives. It is thus reactive rather than anticipatory.

Figure 4:
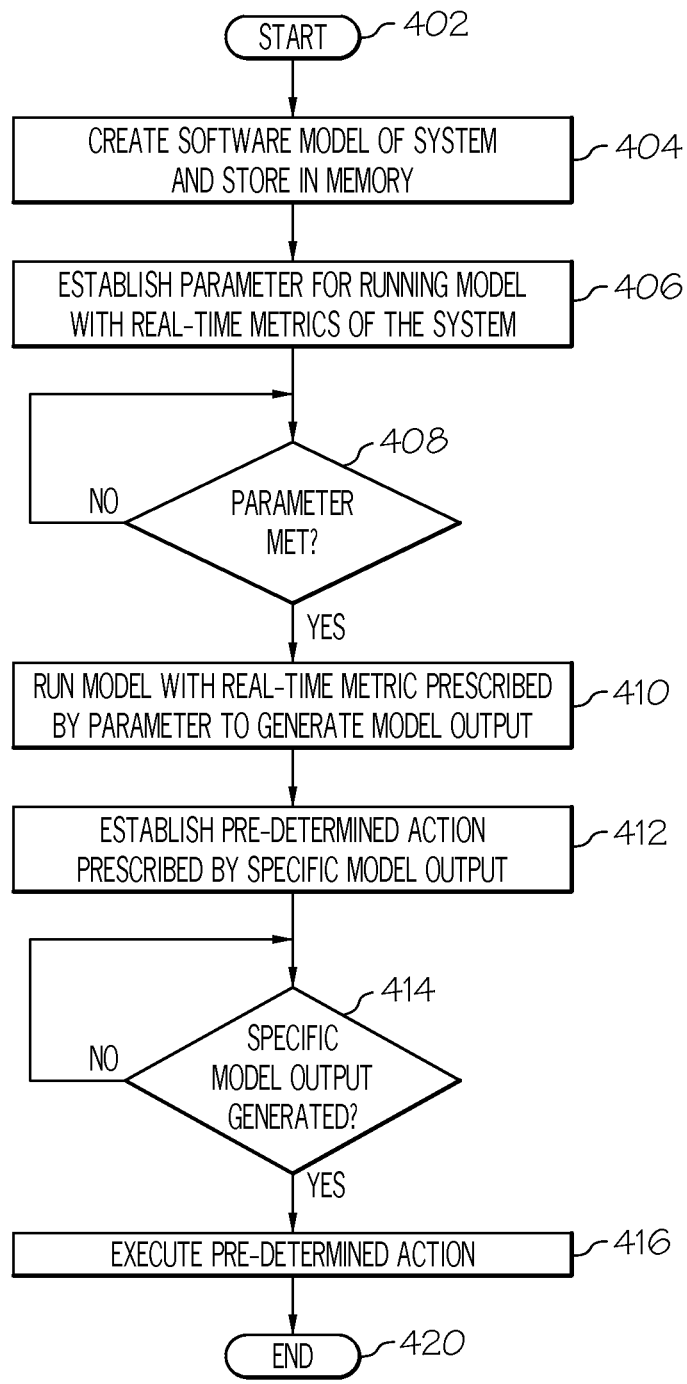
FIG. 4 is a high level flow chart of one or more steps performed by a processor to manage capacity in a service-provider system.

Referring now to FIG. 4, a high level flow chart of one or more steps performed by a processor to manage capacity in a physical service-provider system is presented. After initiator block 402, a software model of a real system is created and stored in memory (e.g., system memory, non-volatile memory such as a disk drive, etc.), as described in block 404. As described in block 406, a parameter is established for running the model by using real-time metrics from the actual system as inputs to the model. Examples of such a parameter include, but are not limited to, passage of a predetermined period of time (e.g., every five minutes); a buffer in the physical real system being overutilized or underutilized according to a predefined level; an increase/decrease (beyond a predefined limit) in service requests being received by the physical real system; a widespread catastrophe such as a natural disaster, outbreak of an armed conflict, grid power failure, etc.

If the predefined parameter is met (query block 408), then the model is run using real-time metrics from the physical system (block 410). Note that the metric can be prescribed by the parameter. That is, the metric used as an input may correlate with a particular parameter. For example, refer again to FIG. 1 and assume that a correlation has been predetermined between the resource depicted in block 2 with a widespread electrical power failure. If a widespread electrical power failure occurs (the "parameter"), then the metric (e.g., a real-time output from the physical resources depicted by block 2) is used as an input to the model of the physical system in order to determine what the effect will be on the physical system.

As described in block 412, a pre-determined action is established/prescribed for a specific model output. This pre-determined action adjusts the capacity in the physical service-provider system. For example, assume that running the model with a particular metric, which is associated-with/prescribed-by a particular parameter/condition, results in a particular output. This particular output has been previously mapped/associated with a particular action, such a shutting down a server farm, bringing additional resources on line; calling upon and bringing on line additional on-demand services from a third party; etc. Thus, if this particular output from the model occurs (query block 414), then that associated pre-determined action is executed (block 416). The process ends at terminator block 420.

Figure 5:
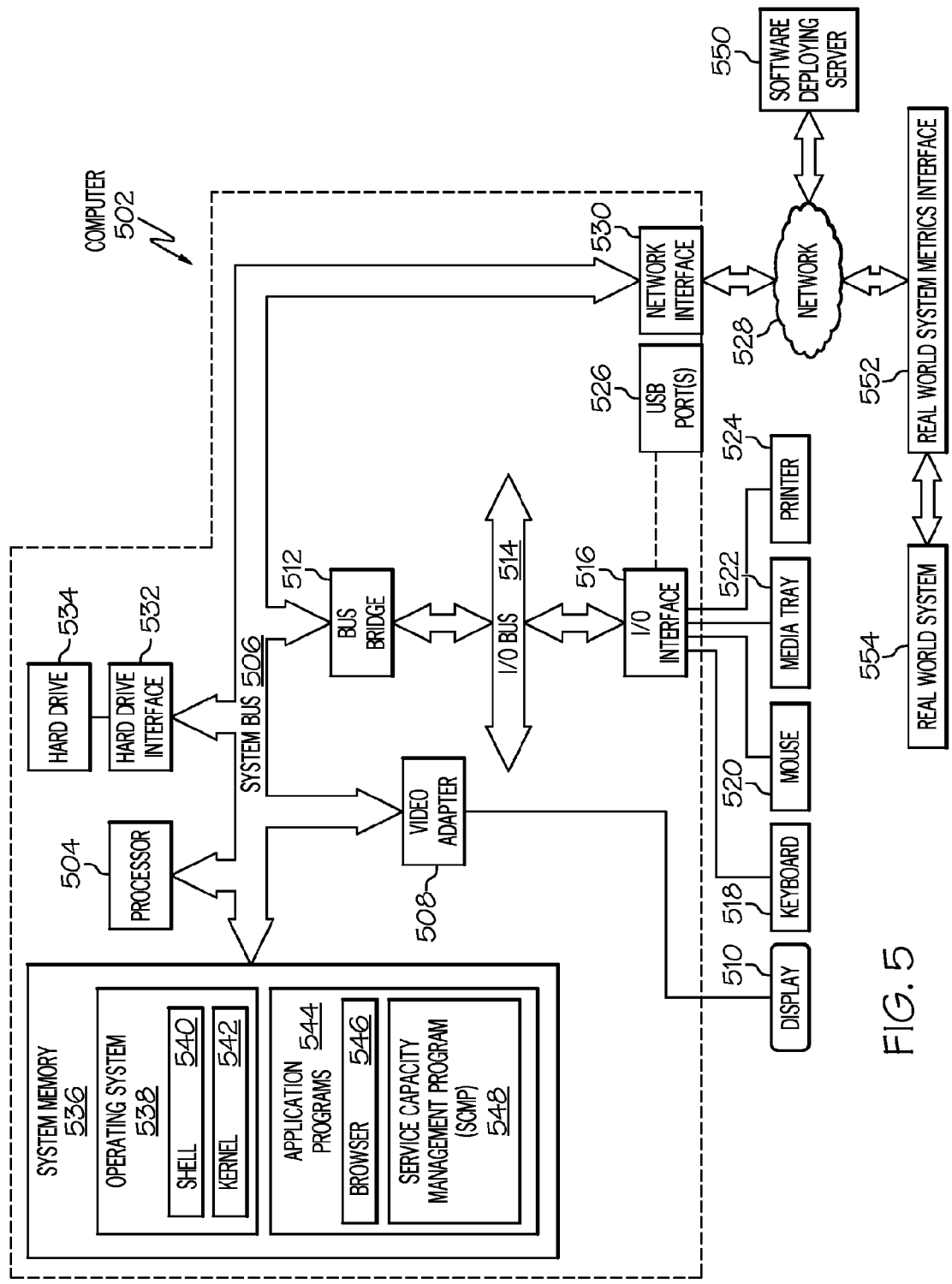
FIG. 5 illustrates an exemplary computer system that may be utilized by one or more of the components depicted in FIGS. 1-2.

With reference now to FIG. 5, there is depicted a block diagram of an exemplary computer 502, which may be utilized by the present invention. Note that some or all of the exemplary architecture, including both depicted hardware and software, shown for and within computer 502 may be utilized by software deploying server 550, a real world system metrics interface 552, and/or a real world system 554 (e.g., a real world physical system of resources such as depicted in FIGS. 1-2). Real world system metrics interface 552 provides an interface to provide the metrics described in FIG. 3 from the real world system 554 to the computer 502.

Computer 502 includes a processor 504 that is coupled to a system bus 506. Processor 504 may utilize one or more processors, each of which has one or more processor cores. A video adapter 508, which drives/supports a display 510, is also coupled to system bus 506. System bus 506 is coupled via a bus bridge 512 to an input/output (I/O) bus 514. An I/O interface 516 is coupled to I/O bus 514. I/O interface 516 affords communication with various I/O devices, including a keyboard 518, a mouse 520, a media tray 522 (which may include storage devices such as CD-ROM drives, multi-media interfaces, etc.), a printer 524, and external USB port(s) 526. While the format of the ports connected to I/O interface 516 may be any known to those skilled in the art of computer architecture, in one embodiment some or all of these ports are universal serial bus (USB) ports.

As depicted, computer 502 is able to communicate with a software deploying server 550, real world system metrics interface 552 and/or real world system 554 using a network interface 530 to a network 528. Network 528 may be an external network such as the Internet, or an internal network such as an Ethernet or a virtual private network (VPN).

A hard drive interface 532 is also coupled to system bus 506. Hard drive interface 532 interfaces with a hard drive 534. In one embodiment, hard drive 534 populates a system memory 536, which is also coupled to system bus 506. System memory is defined as a lowest level of volatile memory in computer 502. This volatile memory includes additional higher levels of volatile memory (not shown), including, but not limited to, cache memory, registers and buffers. Data that populates system memory 536 includes computer 502's operating system (OS) 538 and application programs 544.

OS 538 includes a shell 540, for providing transparent user access to resources such as application programs 544. Generally, shell 540 is a program that provides an interpreter and an interface between the user and the operating system. More specifically, shell 540 executes commands that are entered into a command line user interface or from a file. Thus, shell 540, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 542) for processing. Note that while shell 540 is a text-based, line-oriented user interface, the present invention will equally well support other user interface modes, such as graphical, voice, gestural, etc.

As depicted, OS 538 also includes kernel 542, which includes lower levels of functionality for OS 538, including providing essential services required by other parts of OS 538 and application programs 544, including memory management, process and task management, disk management, and mouse and keyboard management.

Application programs 544 include a renderer, shown in exemplary manner as a browser 546. Browser 546 includes program modules and instructions enabling a world wide web (WWW) client (i.e., computer 502) to send and receive network messages to the Internet using hypertext transfer protocol (HTTP) messaging, thus enabling communication with software deploying server 550 and other described computer systems.

Application programs 544 in computer 502's system memory (as well as software deploying server 550's system memory) also include a service capacity management program (SCMP) 548. SCMP 548 includes code for implementing the processes described below, including those described in FIGS. 1-4. In one embodiment, computer 502 is able to download SCMP 548 from software deploying server 550, including in an on-demand basis, wherein the code in SCMP 548 is not downloaded until needed for execution to define and/or implement the improved enterprise architecture described herein. Note further that, in one embodiment of the present invention, software deploying server 550 performs all of the functions associated with the present invention (including execution of SCMP 548), thus freeing computer 502 from having to use its own internal computing resources to execute SCMP 548.

The hardware elements depicted in computer 502 are not intended to be exhaustive, but rather are representative to highlight essential components required by the present invention. For instance, computer 502 may include alternate memory storage devices such as magnetic cassettes, digital versatile disks (DVDs), Bernoulli cartridges, and the like. These and other variations are intended to be within the spirit and scope of the present invention.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the invention of the present application in detail and by reference to illustrative embodiments thereof, it will be apparent that modifications and variations are possible without departing from the scope of the invention defined in the appended claims.

What is claimed is:

1. A computer implemented method of managing capacity in a service-provider system in a forecast-less manner, the computer implemented method comprising;
   creating a software model of a physical service-provider system;
   a processor storing the software model in memory;
   establishing a parameter for running the software model with real-time metrics from the physical service-provider system as inputs to the software model;
   in response to the parameter being met, running the software model using the real-time metrics from the physical service-provider system as inputs;
   establishing a pre-determined action that is prescribed by a specific model output, wherein the pre-determined action adjusts capacity in the service-provider system; and
   in response to the specific model output being output from the software model, executing the pre-determined action.

2. The computer implemented method of claim 1, further comprising:
   defining the parameter as passage of a predetermined period of time since last running the software model with the real-time metrics from the physical service-provider system.

3. The computer implemented method of claim 1, further comprising:
   defining the parameter as a buffer in the physical service-provider system being underutilized below a predefined limit.

4. The computer implemented method of claim 1, further comprising:
   defining the parameter as a buffer in the physical service-provider system being overutilized beyond a predefined limit.

5. The computer implemented method of claim 1, further comprising:
   defining the parameter as service requests being received by the physical service-provider system falling below a pre-defined limit.

6. The computer implemented method of claim 1, further comprising:

defining the parameter as service requests being received by the physical service-provider system exceeding a pre-defined limit.

7. The computer implemented method of claim 1, further comprising:
defining the parameter as an occurrence of a predefined natural disaster.

8. The computer implemented method of claim 1, further comprising:
defining the pre-determined action as shutting down a server farm.

9. The computer implemented method of claim 1, further comprising:
defining the pre-determined action as bringing additional server resources on line.

10. The computer implemented method of claim 1, further comprising:
defining the pre-determined action as bringing additional on-demand services from a third party source on line.

11. A computer program product for managing capacity in a service-provider system, the computer program product comprising:
a non-transitory computer readable storage media;
first program instructions to create a software model of a physical service-provider system;
second program instructions to store the software model in memory;
third program instructions to establish a parameter for running the software model with real-time metrics from the physical service-provider system as inputs to the software model;
fourth program instructions to, in response to the parameter being met, run the software model using the real-time metrics from the physical service-provider system as inputs;
fifth program instructions to establish a pre-determined action that is prescribed by a specific model output, wherein the pre-determined action adjusts capacity in the service-provider system; and
sixth program instructions to, in response to the specific model output being output from the software model, execute the pre-determined action; and wherein
the first, second, third, fourth, fifth, and sixth program instructions are stored on the non-transitory computer readable storage media.

12. The computer program product of claim 11, further comprising:
seventh program instructions to define the parameter as passage of a predetermined period of time since last running the software model with the real-time metrics from the physical service-provider system; and wherein
the seventh program instructions are stored on the non-transitory computer readable storage media.

13. The computer program product of claim 11, further comprising:
seventh program instructions to define the parameter as a buffer in the physical service-provider system being underutilized below a predefined limit; and wherein
the seventh program instructions are stored on the non-transitory computer readable storage media.

14. The computer program product of claim 11, further comprising:
seventh program instructions to define the parameter as a buffer in the physical service-provider system being overutilized beyond a predefined limit; and wherein the seventh program instructions are stored on the non-transitory computer readable storage media.

15. The computer program product of claim 11, further comprising:
seventh program instructions to define the parameter as service requests being received by the physical service-provider system falling below a pre-defined limit; and wherein the seventh instructions are stored on the non-transitory computer readable storage media.

16. A computer system comprising:
a central processing unit (CPU), a computer readable memory, and a computer readable storage device;
first program instructions to create a software model of a physical service-provider system;
second program instructions to store the software model in memory;
third program instructions to establish a parameter for running the software model with real-time metrics from the physical service-provider system as inputs to the software model;
fourth program instructions to, in response to the parameter being met, run the software model using the real-time metrics from the physical service-provider system as inputs;
fifth program instructions to establish a pre-determined action that is prescribed by a specific model output, wherein the pre-determined action adjusts capacity in the service-provider system; and
sixth program instructions to, in response to the specific model output being output from the software model, execute the pre-determined action; and wherein
the first, second, third, fourth, fifth, and sixth program instructions are stored on the computer readable storage device for execution by the CPU via the computer readable memory.

17. The computer system of claim 16, further comprising:
seventh program instructions to define the parameter as passage of a predetermined period of time since last running the software model with the real-time metrics from the physical service-provider system; and wherein
the seventh program instructions are stored on the computer readable storage media for execution by the CPU via the computer readable memory.

18. The computer system of claim 16, further comprising:
seventh program instructions to define the parameter as a buffer in the physical service-provider system being underutilized below a predefined limit; and wherein
the seventh program instructions are stored on the computer readable storage media for execution by the CPU via the computer readable memory.

19. The computer system of claim 16, further comprising:
seventh program instructions to define the parameter as a buffer in the physical service-provider system being overutilized beyond a predefined limit; and wherein
the seventh program instructions are stored on the computer readable storage media for execution by the CPU via the computer readable memory.

20. The computer system of claim 16, further comprising:
seventh program instructions to define the parameter as service requests being received by the physical service-provider system falling below a predefined limit; and wherein
the seventh instructions are stored on the computer readable storage media for execution by the CPU via the computer readable memory.

* * * * *